United States Patent [19]

Herrick

[11] Patent Number: 4,769,601
[45] Date of Patent: Sep. 6, 1988

[54] METHOD OF AND APPARATUS FOR DETERMINING CEMENT STRENGTH AND EXTENT OF SETTING WITH A PULSED NUCLEAR MAGNETIC RESONANCE SPECTROMETER

[75] Inventor: David C. Herrick, Broken Arrow, Okla.

[73] Assignee: Amoco Corporation, Chicago, Ill.

[21] Appl. No.: 44,541

[22] Filed: Apr. 29, 1987

Related U.S. Application Data

[63] Continuation of Ser. No. 768,379, Aug. 22, 1985, abandoned.

[51] Int. Cl.$^4$ .............................................. G01R 33/20
[52] U.S. Cl. .................................. 324/300; 73/54; 324/318
[58] Field of Search ............... 324/300, 303, 306, 307, 324/308, 309, 318, 321; 436/72, 173; 73/54

[56] References Cited

U.S. PATENT DOCUMENTS

| | | | |
|---|---|---|---|
| 3,932,805 | 1/1976 | Abe et al. | 324/309 |
| 4,321,538 | 3/1982 | Abe et al. | 324/318 |

FOREIGN PATENT DOCUMENTS

| | | | |
|---|---|---|---|
| 0966567 | 10/1982 | U.S.S.R. | 324/300 |
| 0966568 | 10/1982 | U.S.S.R. | 324/300 |
| 1038849 | 8/1983 | U.S.S.R. | 324/300 |

OTHER PUBLICATIONS

L. J. Schreiner et al., "NMR Line Shape . . . Cement Hydration", J. Am. Ceram. Soc., vol. 68, No. 1, 1985.
L. Barbic et al., "The Determination of Surface Development in Cement Pastes by Nuclear Magnetic Resonance", J. Am. Ceram. Soc., vol. 65, No. 1, 1982.
J. R. Barnes et al., "Hydration of Portland Cement . . . NMR Spectroscopy", J. of Materials Science Letters, vol. 4, No. 10, Oct. 1985.

Primary Examiner—Stewart J. Levy
Assistant Examiner—Kevin D. O'Shea

[57] ABSTRACT

A method and apparatus for determining both the extent of setting of cement and strength of cement as it sets by utilizing a pulsed nuclear magnetic resonance spectrometer, to follow the cementation or hydration reaction of the cement. Cement samples can be agitated to simulate the transport and placing of a cement and/or exposed to temperatures and pressures similar to that of the environment wherein the cement will be placed and set.

32 Claims, 2 Drawing Sheets

METHOD OF AND APPARATUS FOR DETERMINING CEMENT STRENGTH AND EXTENT OF SETTING WITH A PULSED NUCLEAR MAGNETIC RESONANCE SPECTROMETER

This is a continuation of application Ser. No. 768,379 filed 8/22/85, abandoned.

BACKGROUND OF THE INVENTION

This invention is related to a method of and apparatus for analysis of cement and more particularly, analysis of cement used to secure pipe string in a wellbore drilled into the earth, with a pulsed nuclear magnetic resonance spectrometer.

In utilizing cement for construction purposes, there is a need to be able to determine both the extent of setting and strength of the cement once the cement has begun to set. A knowledge of the extent of setting allows one to determine how much time is available to transport and place the cement, thereby preventing the cement from setting in the cement transport and/or cement placing means. A knowledge of the cement strength as it sets, enables one to determine when the cement has enough strength to either support and/or secure other objects or to support itself.

In the drilling of wellbores for the production of hydrocarbons from subterranean strata, cement is pumped into the annulus between the pipe string run into the wellbore and the wall of the wellbore to both secure the pipe string in the wellbore and to prevent communication between different subsurface strata from occurring in the annulus between the pipe string and the wall of the wellbore. In placing this cement in the annulus, it is common practice to pump a volume of cement slurry sufficient to fill this annulus down the pipe string and then to displace this volume of cement slurry from the pipe string into the annulus, by pumping a displacing fluid, such as drilling mud, behind the cement slurry. It is important in conducting this operation to know the extent of setting of the cement used under wellbore conditions, in order to ensure that there is sufficient time to place the cement in the annulus between the pipe string and the wellbore wall, thereby preventing the cement from setting in the pipe string. Further, it is important to know the strength of the cement as it sets in the annulus between the pipe string and the wellbore wall, so as to be able to determine when the cement has enough strength to support and secure the pipe string in the wellbore.

Accordingly, there is a need for a method of and apparatus for analysis of cement and, more particularly, analysis of cement used to secure pipe string in a wellbore drilled into the earth, to determine both the extent of setting of the cement and the strength of the cement as it sets.

BRIEF DESCRIPTION OF THE INVENTION

In the present invention, the general object of providing a method of an apparatus for analysis of cement to determine both the extent of setting of the cement and the strength of the cement as it sets, is obtained by utilizing a pulsed nuclear magnetic resonance (PNMR) spectrometer to conduct tests on samples of cement.

In U.S. Pat. No. 4,295,365, "NMR Analysis of Subterranean Reservoir Samples Immersed in Liquid Halocarbons," Indurani D. Meshri, inventor, there is disclosed a method of conducting nuclear magnetic resonance analysis on rock samples of a subterranean formation. In this method, the sample is saturated with an aqueous liquid and immersed in a liquid halocarbon containing no hydrogen atoms. The sample is then subjected to nuclear magnetic resonance analysis to determine the porosity and bound water of the sample.

As is well known, the curing or setting of cement can be related to the chemical reaction occurring between the free water in the cement and the chemical constituents of the cement. This chemical reaction involves a consumption of the free water. It has been determined that a pulsed nuclear magnetic resonance spectrometer can be used to provide a measure of the free water content of a cement, thereby providing a measure of the extent of curing or setting which has occurred in the cement.

Specifically, it has been determined that pulsed nuclear magnetic resonance spectrometer amplitude measurements made on a sample of cement can be used to measure both the extent of curing or setting of the cement and the strength of the cement as the cement sets.

In one method of so making and using amplitude measurements, the cement sample can be agitated, in order to simulate the transport and placing of the cement, and exposed to conditions similar to those of the environment wherein the cement will be placed. Pulsed nuclear magnetic resonance spectrometer amplitude measurements are then taken. As in other techniques, it is possible to empirically correlate the amplitude measurements to viscosity, while the cement is still in a transportable form, i.e. a placeable or pumpable slurry form. It is also possible to empirically correlate the amplitude measurements to cement strength, after the cement has set to the extent that it is no longer transportable. In this way, these pulsed nuclear magnetic resonance spectrometer amplitude measurements can be used to monitor the setting process of the cement, first to determine when the cement has set to the extent that it is no longer transportable and the time required for this to happen, and second to determine the strength of the cement as the cement sets and is no longer transportable. Such information can be used in both the design of the physical operating parameters of cementing operations and in choosing the cement composition to be used in the cementing operation, and to monitor the setting of the cement in place. Such information can also be used to compare the cement sample to another cement sample, thereby providing a means of quality control by providing a means of ensuring that the two samples are essentially the same.

It has further been determined that pulsed nuclear magnetic resonance spectrometer thermal relaxation time measurements made on a sample of cement can be used to measure both the extent of curing or setting of the cement and the strength of the cement as the cement sets.

In one method of so making and using thermal relaxation time measurements, the cement sample can be agitated, in order to simulate the transport and placing of the cement, and exposed to conditions similar to those of the environment wherein the cement will be placed. Pulsed nuclear magnetic resonance spectrometer thermal relaxation time measurements are then taken. As in other techniques, it is possible to empirically correlate the thermal relaxation time measurements to viscosity, while the cement is still in a transportable form, i.e. a placeable or pumpable slurry form.

It is also possible to empirically correlate the thermal relaxation time measurements to cement strength, after the cement has set to the extent that it is no longer transportable. In this way, these pulsed nuclear magnetic resonance spectrometer thermal relaxation time measurements can be used to monitor the setting process of the cement, first to determine when the cement has set to the extent that it is no longer transportable and the time required for this to happen and second to determine the strength of the cement as the cement sets and is no longer transportable. Such information can be used in both the design of the physical operating parameters of cementing operations and in choosing the cement compositions to be used in the cementing operation, and can be used to monitor the setting of the cement in place. Such information can also be used to compare the cement sample to another cement sample, thereby providing a means of quality control by providing a means of of ensuring that the two cement samples are essentially the same.

DETAILED DESCRIPTION OF THE INVENTION

Briefly, the practice of the present invention involves a method of and apparatus for analyzing a cement sample to determine both the extent of setting of the cement and the strength of the cement as it sets, by utilizing a pulsed nuclear magnetic resonance spectrometer to conduct tests on the cement samples. The curing or setting of cement can be related to the chemical reaction occurring between the free water in the cement slurry and the chemical constituents of the cement. The consumption of water in this reaction, and hence the extent of curing or setting of the cement can be determined by making amplitude and thermal relaxation time measurements on the sample of cement with a pulsed nuclear magnetic resonance spectrometer.

It should be noted that the term "cement" as used in this application refers to the mixture of cementatious material formed by combining water with hydraulic cement, from the time water is first combined with the hydraulic cement and the mixture is in a transportable form through to the time the mixture cures or sets to a hard product. Portland cements are the basic hydraulic cements now being used for oil well type cementing and are often mixed with such things as accelerators, retarders, dispersants, and loss circulation agents to meet specific well conditions.

Figure 1:
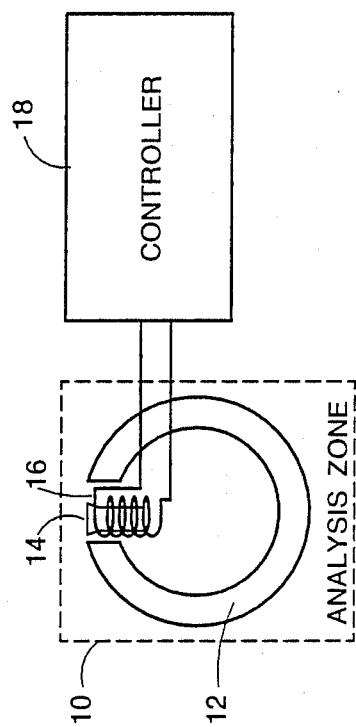
FIG. 1 is a schematic view of a pulsed nuclear magnetic resonance spectrometer useful in the present invention.

The pulsed nuclear magnetic resonance spectrometer apparatus required to conduct such an analysis on a cement sample is shown in FIG. 1. The sample of cement is placed in sample holder 14. The sample holder 14 fits inside the center of a wire coil 16 which in turn is mounted between the poles of magnet 12. The central axis of the wire coil 16 is oriented perpendicular to the permanent magnetic field of magnet 12. The sample holder 14, the wire coil 16, and the magnet 12 comprise the anaylsis zone 10 of the pulsed nuclear magnetic resonance spectrometer. The remaining part of the pulsed nuclear magnetic resonance spectrometer is the controller 18 comprising timing, oscillator, reciever amplification circuitry, and a microcomputer.

It is thought that hydrogen nuclei (protons) in water or any hydrogen-bearing substance generate the electronic signal measured by the pulsed nuclear magnetic resonance spectrometer. These hydrogen protons, oriented in a permanent magnetic field generated by magnet 12, are temporarily reoriented in a second magnetic field generated by passing current through wire coil 16. When the second field is removed, the protons gradually loose the orientation associated with that field or relax, generating a signal in the form of a current in wire coil 16 as they do so.

The amplitude (strength) of the signal is proportional to the number of hydrogen nuclei (protons) in the cement sample; the more hydrogen nuclei, the higher the amplitude. If these hydrogen nuclei are those of the free water molecules in the cement sample, then the amplitude is proportional to the concentration of free water in the cement sample. In short, the higher the free water concentration, the higher the amplitude. The free water is thought to be the water that has not reacted with the hydraulic cement.

A plot of amplitude vs time generates a curve, known as a thermal relaxation curve, because it graphically depicts the exponential decay of amplitude with time. The rate of decrease of the amplitude, which is the slope of the thermal relaxation curve at any one time, can be expressed in units of number of protons per second which are relaxing. The slope of a semi-logarithmic plot of amplitude vs time yields the thermal relaxation time, which can be thought of as a number of seconds for relaxation per proton. Consequently, thermal relaxation time is expressed in units of time, but is inversely related to the rate of amplitude decay, and should not be confused with the simple clock time against which amplitude is plotted when measured. Thermal relaxation time can also be thought of as analogous to a half life in radio active decay; i.e., the time it takes for a certain fraction (1/e or about ½) of the protons to relax. Thermal relaxation time is an important concept because it is thought to be controlled in large part by pore size distribution. Bulk water in a test tube has a characteristic thermal relaxation time, but when the water is held in pore spaces, such as within a cement sample, the rate of relaxation is increased. The increase in the thermal relaxation rate is due to the effects of the cement pore surfaces and the composition of these cement pore surfaces surrounding the water in the cement pore spaces. The closer the cement pore surfaces are associated with the water; i.e., the smaller the pores, the more the decay rate is increased and the more the thermal relaxation time is decreased. In short, the smaller the cement pore spaces, the faster the decay rate and the shorter the thermal relaxation time; the larger the cement pore spaces, the slower the decay rate and the longer the thermal relaxation time.

From this basic theory, it can be seen that two aspects of pulsed nuclear magnetic resonance spectrometry data are useful in analyzing cement samples; the amplitude, as a measure of water concentration in the cement sample, and the thermal relaxation time curve, as a measure of both water concentration and relative pore size distribution.

In the formation of cured or hardened cement, i.e., cement which has set to a hard product, a cementation or hydration reaction occurs in the cement slurry between the water and the constituents of the hydraulic cement to form a hydrate, usually tobermorite gel, which is a calcium silica hydrate. This reaction consumes water, which it is thought results in a reduction in amplitude for a given cement sample as the cement sets. Further, as the hydration reaction occurs, hydrates form between the grains of silica and other materials in the cement, reducing the size of the intergranular or cement pore spaces that are occupied by water in the cement sample, thereby reducing the observed pulsed nuclear magnetic resonance spectrometry thermal relaxation time for a cement sample as the cement sets. Because of this, both amplitude and thermal relaxation time can be used as a measure of the extent of the cementation or hydration reaction. With an empirical correlation of either amplitude or thermal relaxation time to cement slurry viscosity for a given cement composition, it is thought that ampltiude or thermal relaxation time can be used to quantitatively determine cement slurry viscosity. Further, with an empirical correlation of either amplitude or thermal relaxation time to cement strength for a given cement composition, it is thought that amplitude or thermal relaxation time can be used to quantitatively measure cement strength.

In one embodiment of the present invention, a cement sample is placed in a suitable sample holder in the analysis zone of a pulsed nuclear magnetic resonance spectrometer and a series of amplitude and thermal relaxation time measurements are taken. Such measurements can be used, with an empirical correlation of amplitude and thermal relaxation time for a given cement composition to viscosity, to determine the cement sample viscosity while the cement is still in a transportable form. From this, the time left for the cement to remain in a transportable form can be determined. In the case of a wellbore cementing application, the time during which the cement slurry will remain pumpable can be determined. In either case, such information can be utilized in designing the operational steps in a cementing operation and in selecting a cement composition to be used in the cementing operation, or for monitoring the setting process of the cement in place.

Such measurements of amplitude and thermal relaxation time can also be used, with an empirical correlation of amplitude and thermal relaxation time to cement strength for a given cement composition once the cement has begun to set and is no longer in a transportable form, to determine cement strength. From this, it can be determined whether or not sufficient strength exists in the cement for the cement to support itself or another object. In the case of a wellbore cementing application, it can be determined whether or not the cement has sufficient strength to support a pipe string in a wellbore. Such information can be utilized in designing the operational steps in a cementing operation and in choosing the cement composition to be used in the cementing operation, or for monitoring the setting of the cement in place.

Such thermal relaxation and amplitude measurements can also be used with amplitude and thermal relaxation time measurements on a cement sample of similar composition, other things being equal, as a means of quality control, i.e., to determine if the two cement samples are essentially the same.

Figure 2:
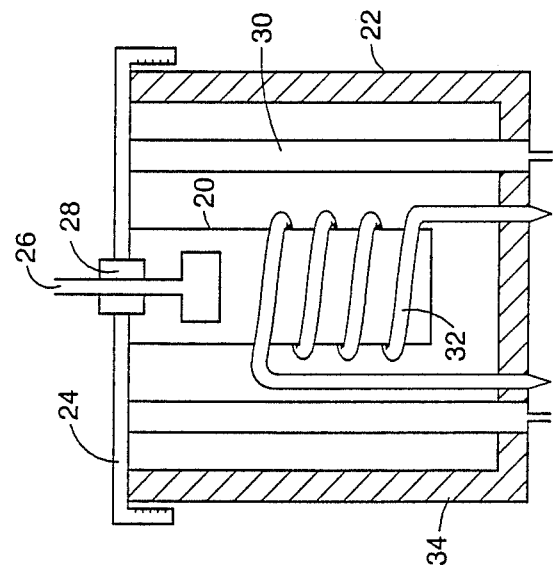
FIG. 2 is a schematic view of a cement sample holder useful in the present invention.

In another embodiment of the present invention, the conditions under which the cement is to be cured are simulated and the cement sample is allowed to set or cure under these conditions. This involves agitation to simulate transport and placement or pumping of the cement, followed by exposure of the cement sample to temperatures and pressures which exist where the cement from which the sample was taken is going to be placed and allowed to set. In the case of wellbore cementing, this invovles exposure of the cement sample to temperatures and pressures that would exist at the bottomhole of the wellbore during the cementing operation. Such a simulation can occur in the analysis zone of a pulsed nuclear magnetic spectrometer or at another location, with the cement sample removed and placed in the analysis zone of a pulsed nuclear magnetic spectrometer for periodic testing. A sample holder, of the type suitable for conducting such a simulation within or outside the analysis zone of a pulsed nuclear magnetic spectrometer, is illustrated in FIG. 2. It should be noted that a requirement of such a sample holder is that every component of such a sample holder must be nonmagnetic. The cement is placed in the sample holder 20 inside pressure cell 22, designed to fit between the poles of the magnet in the analysis zone of a pulsed nuclear magnetic spectrometer. The pressure cell and sample holder are closed and sealed by way of lid 24. Through this lid extends a stirring mechanism 26, such as a rotary blade or reciprocating means for agitating the cement sample to simulate the transport of the cement. The cement sample is prevented from being forced past the stirring mechanism by a sealing mechanism 28 of the type commonly known in the art. Pressure and temperature similar to that existing where the cement will be placed and set, are applied to the cement sample through the pressure cell by means of a heated and pressurized oil containing no hydrogen atoms through an expandable bellows means 30 inside the pressure cell. Because of the requirement that the wire coil 32 be in close proximity to the cement sample, the wire coil 32 is located inside the pressure cell 22. Further, insulation 34 is required to isolate the pressure cell 22 from the external environment.

The use of the method of and apparatus for determining cement strength and extent of setting of a cement with a pulsed nuclear magnetic resonance spectrometer, is illustrated by pulsed nuclear magnetic resonance spectrometer measurements conducted on a slurry of American Petroleum Institute Class A cement and an excess of water prepared in a test tube. The test tube and its contents were placed in a commercially available Praxis pulsed nuclear magnetic resonance spectrometer, containing a large magnet (2.51 kilogauss) and using a coil that both generated and received a 10.72 Mhz radio frequency pulse. Amplitude and thermal relaxation time measurements were made periodically over a 24 hour period as the cement cured or set. The amplitude decreased with time as some of the excess water was used in the cementation reaction. The thermal relaxation time decreased markedly as the cementation reaction occurred. It was concluded that the thermal relaxation time and the amplitude reduction can be used to monitor the progress of the setting process of cement, and can be empirically correlated to the viscosity of the cement while still in a transportable state and to the strength of the cement once it has set to the extent that it is no longer in a transportable state.

While certain embodiments of the invention have been described for illustrating purposes, the invention is not limited thereto and various other modifications or embodiments of the invention will be apparent to those skilled in the art in view of this disclosure since modifications or embodiments are within the scope and spirit of the disclosure.

What is claimed is:

1. A method for analysis of cement suitable for use to secure pipe string in a wellbore drilled into the earth comprising the steps of:
   placing a sample of cement suitable for use to secure pipe string in a wellbore drilled into the earth in an analysis zone of a pulsed nuclear magnetic resonance spectrometer, wherein said sample of cement is set under conditions approximating those of cement in said wellbore, including agitating said sample of cement to simulate the pumping of cement into said wellbore;
   making measurements correlatable with extent of setting of said sample of cement with said pulsed nuclear magnetic resonance spectrometer on said sample of cement while agitating said sample of cement; and
   determining by correlation the extent of setting of said sample of cement from said measurements.

2. A method as recited in claim 1, wherein said step of making measurements comprises making amplitude measurements with said pulsed nuclear magnetic resonance spectrometer on said sample of cement.

3. A method as recited in claim 2, wherein said step of determining by correlation extent of setting comprises utilizing said amplitude measurements to determine by correlation the viscosity of said sample of cement while said sample of cement is still in a transportable form.

4. A method as recited in claim 2, wherein said step of determining by correlation extent of setting comprises further utilizing said amplitude measurements to determine the strength of said sample of cement once it has set to the extent that it is no longer in a transportable state.

5. A method as recited in claim 2, wherein said step of determining by correlation extent of setting comprises utilizing said amplitude measurements to compare to amplitude measurements made on another sample of cement of similar composition to determine if cement samples are essentially the same.

6. A method as recited in claim 1, wherein said step of making measurements comprises making thermal relaxation time mesurements with said pulsed nuclear magnetic resonance spectrometer on said sample of cement.

7. A method as recited in claim 6, wherein said step of determining by correlation extent of setting comprises utilizing said thermal relaxation time measurements to determine by correlation the viscosity of said sample of cement while said sample of cement is still in a transportable form.

8. A method as recited in claim 6, wherein said step of determining by correlation extent of setting comprises utilizing said thermal relaxation time measurements to determine the strength of said sample of cement once it has set to the extent that it is no longer in a transportable state.

9. A method as recited in claim 6, wherein said step of determining by correlation extent of setting comprises utilizing said thermal relaxation time measurements to compare to thermal relaxation time measurements made on another sample of cement of similar composition to determine if cement samples are essentially the same.

10. A method for analysis of cement suitable for use to secure pipe string in a wellbore drilled into the earth comprising the steps of:
    placing a sample of cement suitable for use to secure pipe string in a wellbore drilled into the earth in an analysis zone of a pulsed nuclear magnetic resonance spectrometer, wherein said sample of cement is set under conditions approximating those of cement in said wellbore, including agitating said sample of cement within said analysis zone of said pulsed nuclear magnetic resonance spectrometer;
    making measurements correlatable with extent of setting of said sample of cement with said pulsed nuclear magnetic resonance spectrometer on said sample of cement while agitating said sample of cement within said analysis zone of said pulsed nuclear magnetic resonance spectrometer; and
    determining by correlation the extent of setting of said sample of cement from said measurements.

11. A method for anaylsis of cement suitable for use to secure pipe string in a wellbore drilled into the earth comprising the steps of:
    placing a sample of cement suitable for use to secure pipe string in a wellbore drilled into the earth in an analysis zone of a pulsed nuclear magnetic resonance spectrometer, wherein said sample of cement is set under conditions approximating those of cement in said wellbore, including agitating said sample of cement at one site and moving to and placing in said analysis zone of said pulsed nuclear magnetic resonance spectrometer;
    making measurements correlatable with extent of setting of said sample of cement with said pulsed nuclear magnetic resonance spectrometer on said sample of cement; and
    determining by correlation the extent of setting of said sample of cement from said measurements.

12. Apparatus for anaylsis of cement using a pulsed nuclear magnetic resonance spectrometer comprising:
    a pulsed nuclear magnetic resonance spectrometer;
    nonmagnetic means for holding a sample of cement in an analysis zone of said pulsed nuclear magnetic resonance spectrometer; and
    means for simulating conditions under which cement from which said sample of cement is obtained is to be set, including agitating said sample of cement so as to simulate transport and placement of said cement into a wellbore.

13. Apparatus as recited in claim 12, wherein said means for simulating conditions under which cement from which said sample of cement is obtained is to be set, including agitating said sample of cement so as to simulate transport and placement of said cement into a wellbore, is positioned within said analysis zone of said pulsed nuclear magnetic resonance spectrometer.

14. Apparatus as recited in claim 12, wherein said means for simulating conditions under which cement from which said sample of of cement is to be set, including agitating said sample of cement so as to simulate transport and placement of said cement into a wellbore, is positioned at a site outside the analysis zone of said pulsed nuclear magnetic resonance spectrometer.

15. A method for placing cement suitable for use to secure pipe string in a wellbore drilled into the earth in an annulus between the pipe string and the wellbore comprising the steps of:
    (a) analyzing a sample of such a cement to determine the time required for the cement to set to the extent that it is no longer transportable using a pulsed nuclear magnetic resonance spectrometer by:

(i) placing said sample of cement in the analysis zone of a pulsed nuclear magnetic resonance spectrometer;

(ii) making measurements correlatable with extent of setting of said sample of cement using a pulsed nuclear magnetic resonance spectrometer on said sample of cement;

(iii) determining by correlation the extent of setting of said sample of cement from said measurements; and (b) placing cement in an annulus between the pipe string and the wellbore drilled into the earth while there is sufficient time to prevent the setting of cement in the pipe.

16. A method as recited in claim 15, wherein said step of making measurements comprises making amplitude measurements with said pulsed nuclear magnetic resonance spectrometer on said sample of cement.

17. A method as recited in claim 16, wherein said step of determining by correlation extent of setting comprises utilizing said amplitude measurements to determine by correlation the viscosity of said sample of cement while said sample of cement is still in a transportable form.

18. A method as recited in claim 16, wherein said step of determining by correlation extent of setting comprises utilizing said amplitude measurements to determine the strength of said sample of cement once it has set to the extent that it is no longer in a transportable state.

19. A method as recited in claim 16, wherein said step of determining by correlation extent of setting comprises utilizing said amplitude measurements to compare with amplitude measurements made on another sample of cement of similar composition to determine if cement samples are essentially the same.

20. A method as recited in claim 15, wherein said step of making measurements comprises making a thermal relaxation time measurement with said pulsed nuclear magnetic resonance spectrometer on said sample of cement.

21. A method as recited in claim 20, wherein said step of determining by correlation extent of setting comprises utilizing said thermal relaxation time mesurements to determine by correlation the viscosity of said sample of cement while said sample of cement is in a transportable form.

22. A method as recited in claim 20, wherein said step of determining by correlation extent of setting comprises utilizing said thermal relaxation time measurement to determine the strength of said sample of cement once it has set to the extent that it is no longer in a transportable state.

23. A method as recited in claim 20, wherein said step of determining by correlation extent of setting comprises utilizing said thermal relaxation time measurements to compare with thermal relaxation time measurements made on another sample of cement of similar composition to determine if cement samples are essentially the same.

24. A method as recited in claim 15, wherein said sample of cement sets under conditions approximating conditions under which cement from which said sample of cement is obtained is to be set, including agitating said sample of cement to simulate the pumping of cement into a wellbore.

25. A method as recited in claim 15, wherein said measurements are utilized to monitor setting process of the cement in place.

26. A method for placing cement suitable for use to secure pipe string in a wellbore drilled into the earth using in an annulus between the pipe string and the wellbore comprising the steps of:

(a) analyzing a sample of such a cement to determine the time required for the cement to set to the extent that it is no longer transportable using a pulsed nuclear magnetic resonance spectrometer by;

(i) placing said sample of cement in the analysis zone of a pulsed nuclear magnetic resonance spectrometer;

(ii) making measurements correlatable with viscosity of said sample of cement using a pulsed nuclear magnetic resonance spectrometer on said sample of cement; and (iii) determining by correlation the viscosity of said sample of cement from said measurements; and (b) placing cement in an annulus between the pipe string and the wellbore drilled into the earth while there is sufficient time to prevent the setting of cement in the pipe.

27. A method as recited in claim 26, wherein said step of determining by correlation viscosity comprises utilizing said measurements made with said pulsed nuclear magnetic resonance spectrometer to compare to other measurements with a pulse nuclear magnetic resonance spectrometer made on another sample of cement of similar composition to determine if cement samples are essentially the same.

28. A method as recited in claim 26, wherein the viscosity of said sample of cement is determined by correlation under conditions approximating conditions under which cement from which said sample is obtained, including agitating said sample of cement while said sample of cement is still in a transportable form to simulate the pumping of cement into a wellbore.

29. A method for placing cement suitable for use to secure pipe string in a wellbore drilled into the earth in an annulus between the pipe string and a wellbore comprising the steps of:

(a) analyzing a sample of such a cement to determine the time sufficient for the cement to have the strength to support the pipe using a pulsed nuclear magnetic resonance spectrometer by;

(i) placing said sample of cement in the analysis zone of a pulsed nuclear magnetic resonance spectrometer;

(ii) making measurements correlatable with strength of cement of said sample of cement using a pulsed nuclear magnetic resonance spectrometer on said sample of cement;

(iii) determining by correlation the strength of said sample of cement from said measurements; and (b) placing said cement in an annulus between the pipe string and the wellbore and allowing the cement to set for a time sufficient for the cement to have the strength to support the pipe.

30. A method as recited in claim 29, wherein said step of determining by correlation strength of cement comprises utilizing said measurements made with said pulsed nuclear magnetic resonance spectrometer to compare to other measurements made with a pulsed nuclear magnetic resonance spectrometer made on another sample of cement of similar composition to determine if cement samples are essentially the same.

31. A method as recited in claim 29, wherein said sample of cement sets under conditions approximating conditions under which cement from which said sample of cement is obtained is to be set, including agitating said sample of to simulate the pumping of cement into a wellbore.

32. A method as recited in claim 29, wherein said measurements are utilized to monitor setting process of the cement in place.

* * * * *

UNITED STATES PATENT AND TRADEMARK OFFICE
CERTIFICATE OF CORRECTION

PATENT NO.   :   4,769,601

DATED        :   September 6, 1988

INVENTOR(S)  :   David C. Herrick

It is certified that error appears in the above-identified patent and that said Letters Patent is hereby corrected as shown below:

Column 1, line 61, "an" should read --and--.

Column 5, lines 3 and 4, after "in" and before "amplitude" insert --observed pulsed nuclear magnetic resonance spectrometer--.

Signed and Sealed this

Twenty-fourth Day of January, 1989

*Attest:*

DONALD J. QUIGG

*Attesting Officer*          *Commissioner of Patents and Trademarks*